US008896348B2

(12) United States Patent
Kuroki et al.

(10) Patent No.: US 8,896,348 B2
(45) Date of Patent: Nov. 25, 2014

(54) SEMICONDUCTOR APPARATUS

(71) Applicant: Elpida Memory, Inc., Tokyo (JP)

(72) Inventors: Koji Kuroki, Tokyo (JP); Ryuji Takishita, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/088,116

(22) Filed: Nov. 22, 2013

(65) Prior Publication Data
US 2014/0132316 A1    May 15, 2014

Related U.S. Application Data

(63) Continuation of application No. 12/871,564, filed on Aug. 30, 2010, now Pat. No. 8,604,835.

(30) Foreign Application Priority Data

Aug. 28, 2009   (JP) ................. 2009-198794

(51) Int. Cl.
| G01R 25/00 | (2006.01) |
| H03D 13/00 | (2006.01) |
| H03K 5/24 | (2006.01) |
| H03L 7/081 | (2006.01) |
| H03L 7/085 | (2006.01) |
| G11C 7/22 | (2006.01) |

(52) U.S. Cl.
CPC .............. *H03K 5/249* (2013.01); *H03L 7/0816* (2013.01); *H03L 7/085* (2013.01); *H03L 7/0814* (2013.01); *G11C 7/222* (2013.01)
USPC .................... 327/9; 327/2; 327/141

(58) Field of Classification Search
USPC .............. 327/2–12, 41, 144–163; 331/15–17; 375/373–376
See application file for complete search history.

(56) References Cited

U.S. PATENT DOCUMENTS

| 6,265,903 | B1 | 7/2001 | Takahashi | |
| 7,602,876 | B2 | 10/2009 | Harrison | |
| 7,961,014 | B2* | 6/2011 | Behel | 327/108 |
| 2002/0154721 | A1* | 10/2002 | Harrison | 375/374 |
| 2003/0107420 | A1* | 6/2003 | Hsu et al. | 327/157 |
| 2005/0083091 | A1 | 4/2005 | Lakshmikumar et al. | |
| 2005/0185746 | A1 | 8/2005 | Jung | |
| 2008/0030247 | A1 | 2/2008 | Haerle et al. | |

(Continued)

FOREIGN PATENT DOCUMENTS

JP    2002-296326 A    10/2002

*Primary Examiner* — Brandon S Cole
(74) *Attorney, Agent, or Firm* — McGinn IP Law Group, PLLC

(57) ABSTRACT

In a semiconductor device, there are provided first to third pairs of nMOS transistors between a GND and two sense nodes and first to third pairs of pMOS transistors between the two sense nodes and the power supply. A first internal clock signal and its inverted signal are supplied to gates of the first pair of nMOS transistors and the second pair of nMOS transistors, respectively. Complementary external clock signals are supplied to the gates of the third pairs of nMOS transistors and the third pairs of pMOS transistors. An inverted version of a second internal clock signal and the second internal clock signal are supplied to gates of the first and second pairs of pMOS transistors. The two sense nodes are connected to inputs of a differential amplifier. The output of the differential amplifier is latched by a latch circuit. An equalizing circuit precharges/equalizes the two sense nodes.

20 Claims, 7 Drawing Sheets

(56) References Cited

U.S. PATENT DOCUMENTS

2010/0066420 A1   3/2010  Kaneko
2010/0237917 A1*  9/2010  Monma ........................ 327/158
2011/0095784 A1*  4/2011  Behel ............................. 326/82

* cited by examiner

SEMICONDUCTOR APPARATUS

This Application is a Continuation Application of U.S. patent application Ser. No. 12/871,564, filed on Aug. 30, 2010, now U.S. Patent No. tbd.

TECHNICAL FIELD

Reference to Related Application

This application is based upon and claims the benefit of the priority of Japanese patent application No. 2009-198794, filed on Aug. 28, 2009, the disclosure of which is incorporated herein in its entirety by reference thereto.
This invention relates to a semiconductor device and, more particularly, to a semiconductor device having a phase detection circuit.

BACKGROUND

Recently, a synchronous memory which performs an operation synchronized with a clock signal, has come into widespread use as a main memory of, for example, a personal computer. In particular, in a clock-synchronous memory such as a DDR (Double Date Rate) memory, input/output data need to be correctly synchronized with respect to an external clock signal. Hence, a DLL (Delay Lock Loop) circuit that generates an internal clock signal, synchronized with the external clock signal, is indispensable.

The DLL circuit is provided with a phase detection circuit that detects whether or not the internal clock signal is correctly in phase with the external clock signal.

FIG. 5 shows a typical configuration of the phase detection circuit of this sort of the related technique. Referring to FIG. 5, the phase detection circuit includes nMOS transistors M1 and M4 which have sources connected to a low potential power supply VSS1, gates supplied with an internal clock RCLK in common, and drains coupled together;

an inverter INV1 that receives the internal clock RCLK to output its inverted signal (delay time=td1);

nMOS transistors M2 and M5 which have sources connected to the coupled drains of the nMOS transistors M1 and M4, gates supplied with an output signal of the inverter INV1 in common, and drains coupled together;

nMOS transistors M3 and M6 which have sources connected to the coupled drains of the nMOS transistors M2 and M5, gates supplied with an external clock signal CK and a signal /CK that is reverse-phased respect to the clock signal CK, and drains connected to nodes LSAT and LSAB (termed sense nodes), respectively;

pMOS transistors MP11 and MP12 which have sources connected in common to a high potential power supply VDD1, gates connected in common to an equalization signal /EQ which is activated at a Low level, and drains connected to the sense nodes LSAT and LSAB;

a PMOS transistor MP13 which is connected between the drains of the pMOS transistors MP11 and MP12, and has a gate connected to the signal /EQ;

a differential amplifier (also termed a 'sense amplifier' or a 'differential sense amplifier) AMP that has differential inputs connected to the sense nodes LSAT and LSAB, respectively; and a latch circuit 11 that latches an output (single-ended output) of the sense amplifier AMP to produce the so latched sense amplifier output as a phase adjustment signal LOUT.

In the terms 'sense node LSAT' and 'sense node LSAB', T and A denote True and Bar, respectively. These sense nodes thus differentially transfer a signal. The internal clock signal has an amplitude between VDD1 and VSS1, while the external clock signals CK and /CK have an amplitude between VDD2 and VSS2. Normally, the amplitudes of the external clock signals CK and /CK are smaller than the amplitude of the internal clock signal. The center of amplitude of the external clock signals CK and /CK is set so as to be approximately equal to that of the internal clock signal RCLK, though not limited thereto. Since the amplitude of the external clock signals CK and /CK is smaller than that of the internal clock signal RCLK, as stated above, VDD1 is higher in potential than VDD2, while VSS1 is lower in potential than VSS2.

The operation of the phase detection circuit of FIG. 5 will now be described.

Before starting the phase detection operation, the equalization signal /EQ is set to Low level. This causes the pMOS transistors MP11 to MP13 to be made conductive, so that the sense nodes LSAT, LSAB are both precharged and equalized at a power supply potential VDD1 level.

The equalization signal /EQ is then set to High level to cancel precharging/equalization. If, in this state, the internal clock signal RCLK rises from the Low level (VSS1) to the High level (VDD1), the nMOS transistors M1 and M4 are made conductive.

An output signal of the inverter INV1 is at High level (VDD1) when the internal clock signal RCLK remains Low (VSS1). The output signal of the inverter INV1 falls from the High level (VDD1) to the Low level (VSS1) with a delay of td1 from a time point of rising of the internal clock signal RCLK from the Low level (VSS1) to the High level (VDD1).

The time interval from the rising of the internal clock signal RCLK until the fall of the output signal of the inverter INV1 corresponds to the delay time td1 of the inverter INV1. During this time interval, the internal clock signal RCLK and an output signal of the inverter INV1 (signal obtained on inverting RCLK and delaying it by td1) are both High (VDD1), so that the nMOS transistors M1, M2, M4, and M5 are made conductive. That is, the delay time td1 of the inverter INV1 prescribes the time interval during which the nMOS transistors M1, M2, M4 and M5 are conductive simultaneously, and hence the sampling interval by the phase detection circuit.

In FIG. 5, the sources of the nMOS transistors M2 and M5 which have gates supplied with the output signal of the inverter INV1 in common, are connected to the coupled drains of the nMOS transistors M1 and M4. Hence, the gate-to-source voltages of the nMOS transistors M2 and M5 are identical, and hence the nMOS transistors M2 and M5 are set in a conduction state or a non-conduction state in common.

The source potentials of the nMOS transistors M3 and M6 are common (the coupled sources of the nMOS transistors M3 and M6 are connected to the coupled drains of the nMOS transistors M2 and M5). The nMOS transistors M3 and M6 are made conductive when their gate-to-source voltages are not lower than a threshold voltage.

The amplitude of the external clock signals CK and /CK is smaller than that of the internal clock signal RCLK. Hence if the nMOS transistors M1 to M6 are fabricated to have a size corresponding to the amplitude of the internal clock signal RCLK, that is, the threshold voltages of the nMOS transistors M1 to M6 are set to have a value corresponding to the power supply voltages VDD1 and VSS1, the gate-to-source voltages of the nMOS transistors M3 and M6, whose gates receive the external clock signals CK and /CK, do not become smaller than the threshold value when the external clock signals CK and /CK assume Low level (VDD2). Hence, the nMOS transistors M3 and M6 receiving the external clock signals CK and /CK at gates thereof are both made conductive.

In this case, the current (drain current) that flows through one of the nMOS transistors M3 and M6 receiving one of the external clock signals CK and /CK having the High level (VDD2) at its gate becomes larger than the current (drain current) that flows through the other transistor receiving the Low level (VSS2) at its gate. The reason for this is that the gate-to-source voltage of the one of the nMOS transistors M3 and M6 receiving the High level (VDD2) of the external clock signal at its gate becomes larger than the gate-to-source voltage of the other transistor receiving the Low level (VSS2) of the external clock signal at its gate.

On the other hand, in case one of the nMOS transistors M3 and M6 receiving the external clock signal of the High level (VDD2) at gates thereof is in a conduction state, the other transistor, receiving the Low level external clock signal (VSS2), may be in a non-conduction state, depending on the size of the nMOS transistors M1 to M6, the amplitude and the common voltage of the external clock signals CK and /CK differentially transmitted.

In case the external clock signal CK rises to High (VDD2) from Low level (VSS2) before the internal clock signal RCLK rises from the Low level (VSS1) to the High level (VDD1), the external clock signal CK is at High level (VDD1) during the sampling period. This sampling period having a time width td1, begins as the transistors M1, M2, M4 and M5 change from a non-conduction state to a conduction state in response to the rise of the internal clock signal RCLK.

As a result, the nMOS transistor M3 is made conductive to render a discharge path between the sense node LSAT and the low-potential power supply VSS1 (LSAT→M3→M2→M1→VSS1) electrically conductive. On the other hand, since the reverse-phase external clock signal /CK is Low (VSS2), the nMOS transistor M6 is either in a conduction state in which the drain current of the nMOS transistor M6 is smaller than that of the nMOS transistor M3, or in a non-conduction state. A discharge path between the sense node LSAB and the low potential power supply VSS1 (LSAB→M6→M5→M4→VSS1) is either in a conduction state with the discharge current smaller than that on the LSAT side, or in a non-conduction state.

The discharging of the sense nodes LSAT and LSAB occurs, during the sampling period, in response to the High level (VDD2)/Low level (VSS2) of the external clock signals CK and /CK. It is observed that the sampling period begins with a time point of transition from the non-conduction states to the conduction states of the transistors M1, M2, M4 and M5 in response to the rise of the internal clock signal RCLK, and is prescribed as the delay time td1 of the inverter INV1.

For example, if the phase of the external clock signal CLK advances with respect to the internal clock signal RCLK, the level of the clock signal during the sampling period is set to High level (VDD1). Hence, at the end of the sampling period, the potentials on the sense nodes LSAT and LSAB are such that LSAT<LSAB.

The sense amplifier AMP has a non-inverting input terminal (−) and an inverting input terminal (+) connected to the sense nodes LSAT and LSAB, respectively, and amplifies the difference between the potentials of the sense nodes LSAT and LSAB. The amplified result is delivered, as a single-ended output of a High level (VDD1) or a Low level (VSS1), to a latch circuit L1. The latch circuit L1 outputs the signal supplied from the sense amplifier AMP, as a phase adjustment signal LOUT.

If the potential relationship between the sense nodes LSAT and LSAB is such that LSAT<LSAB, the output of the sense amplifier AMP is High (VDD1).

On the other hand, if the external clock signal CK rises from the Low level (VSS2) to the High level (VDD2) at a time delayed from the rise of the internal clock signal RCLK from the Low level (VSS1) to the High level (VDD1), the external clock signal CK is set to Low (VSS2) and the reverse-phased external clock signal /CK, is set to High (VDD2) during the sampling period that has a time duration td1 and starts at the time point of the rise of the internal clock signal RCLK.

As a result, the nMOS transistor M6 is made conductive, and hence the discharge path between the sense node LSAB and the low potential power supply VSS (LSAB→M6→M5→M4→VSS1) is rendered conductive. At this time, the external clock signal CK is at Low level (VSS2). Hence, the nMOS transistor M3 is either in a conduction state, with the drain current smaller than that of the nMOS transistor M6, or in a non-conduction state. The discharge current in the discharge path between the sense node LSAT and the low-potential power supply VSS1 (LSAT→M3→M2→M1→VSS1) is smaller than that on the LSAB side, or the discharge path is made non-conductive.

That is, when the external clock signal CK has a phase delayed with respect to the internal clock signal RCLK, the potential at the sense nodes LSAT and LSAB at the end of the sampling period is such that LSAB<LSAT. The output of the sense amplifier AMP goes to Low level (VSS1).

It is seen from above that the difference in the potential between the sense nodes LSAT and LSAB at the end of the sampling period represents the phase relationship between the internal clock signal RCLK and the external clock signal CK.

In the configuration example of FIG. 5, the sense amplifier AMP receives the internal clock signal RCLK as an activation control signal, and is activated during the period when the internal clock signal RCLK is High (VDD1). However, the sense amplifier AMP is as a matter of course not limited to such an arrangement.

As regards the phase detection circuit for detecting the phase difference of a plurality of signals, reference may be made to, for example, the Patent Document 1.

[Patent Document 1]
JP Patent Kokai Publication No. JP2002-296326A

SUMMARY

The following is an analysis by the present invention.

Recently, with increase in the operating speed and lowering in the operating voltage of the semiconductor device, the amplitude of the external clock signals CK and /CK is becoming smaller. If the amplitude of the external clock signals CK and /CK is smaller, the gate-to-source voltage in the nMOS transistors M3 and M6 for the High level (VDD2) of the external clock signals CK and /CK in FIG. 5 becomes lower and the drain-to-source currents of the nMOS transistors M3 and M6 become smaller. That is, the current driving capability of the nMOS transistors M3 and M6 discharging the charge in the sense nodes LSAT and LSAB becomes smaller. The current driving capability of the nMOS transistors also becomes smaller by reduction in the transistor size with the progress in miniaturization in the semiconductor fabrication process.

If the current driving capability of the nMOS transistors M3 and M6 becomes smaller, there is raised a problem that the potential difference between the sense nodes LSAT and LSAB at the end of the sampling period is decreased. This leads to a problem that an erroneous amplification occurs, or the time for amplification is increased in the sense amplifier AMP.

To cope with the above mentioned problem that the potential difference between the sense nodes LSAT and LSAB at the end of the sampling period is small due to the small current driving capability of the nMOS transistors M3 and M6, it is possible to use such a technique of further elongating the sampling time (delay time td1) of the inverter INV1.

However, if the sampling period is elongated, the probability that the phase detection is affected by noise becomes high, such as variations in the power supply voltage, as a result of which the phase detection is not improved but rather is deteriorated in accuracy.

If the phase detection with high accuracy is to be accomplished, it is desirable that the delay time td1 of the inverter INV1 is as small as practicable. That is, to accomplish the phase detection with high accuracy, it is desirable, from the findings by the present inventors, that
the sampling period is as short as possible; and
the phase is detectable with an input of a smaller amplitude.

To solve one or more of the above mentioned problems, the present invention provides a semiconductor device that has a charging path and a discharging path configured for sense nodes for phase detection and that includes a phase detection circuit for detecting the phase difference between a plurality of signals.

According to the present invention, first and second signals, whose phase difference is to be detected, are entered. If, during the sampling period prescribed as a predetermined time period beginning from a transition edge from the first value to the second value of the first signal, the second signal is of the second value, the discharge path for the sense nodes is rendered electrically conductive. If the second signal is of the first value, the charging path for the sense node is rendered electrically conductive.

According to the present invention, it is possible to prevent erroneous decision in phase detection to suppress the time of phase detection from increasing to provide a high precision phase detection circuit without protracting the sampling period.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
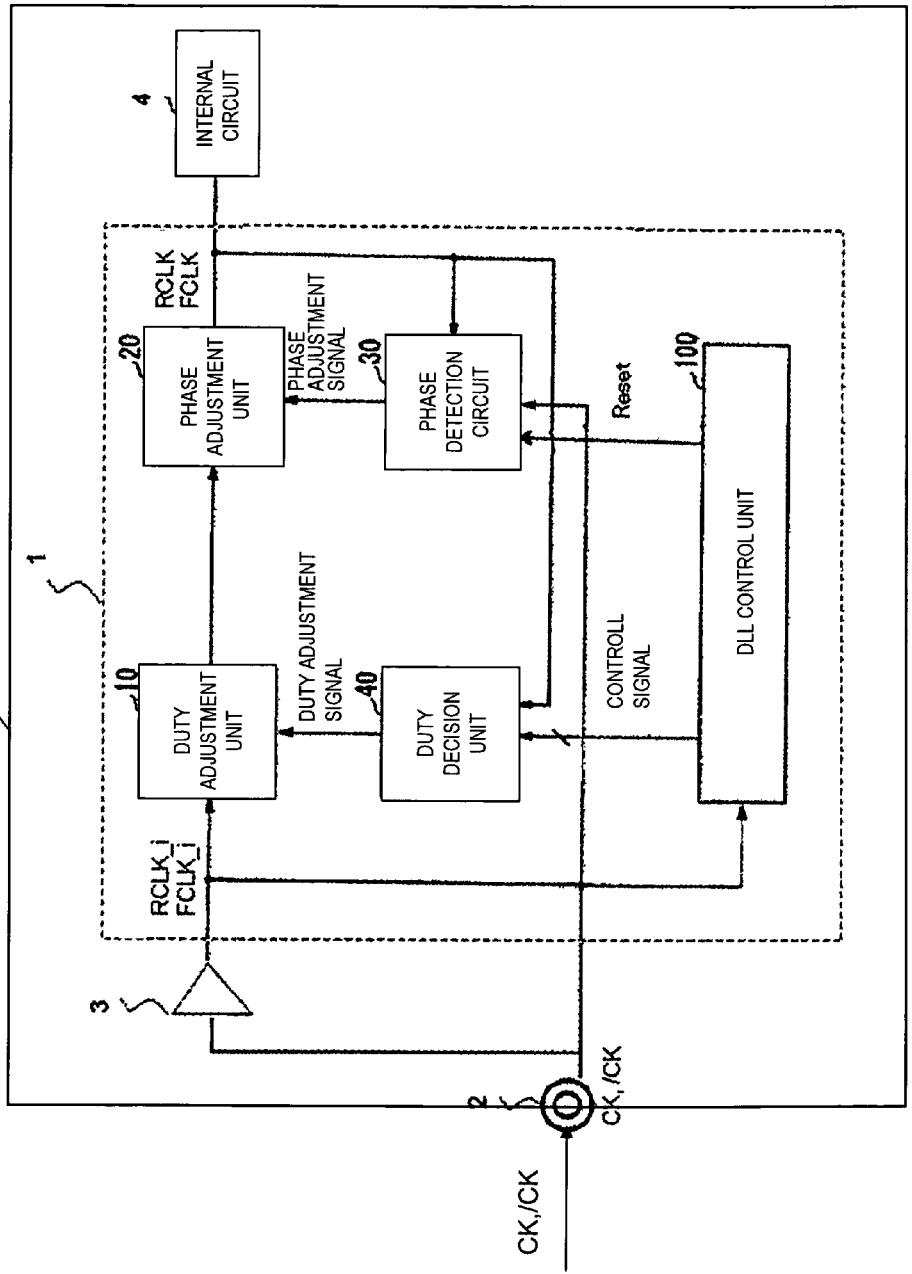
FIG. 1 is a block diagram showing the configuration of a DLL circuit according to an exemplary embodiment of the present invention.

One of preferred modes of the present invention will now be described. A phase detection circuit arranged in a semiconductor device according to the present invention includes a path for charging sense nodes configured for phase detection and a path for discharging the sense nodes. The sense nodes include first and second sense nodes (LSAT, LSAB).

The discharge path for the first and second sense nodes (LSAT, LSAB) includes two sets of first, second and third transistors (M1, M2, M3) and (M4, M5, M6) connected in series between a first power supply (VSS1) and the first and second sense nodes (LSAT, LSAB), respectively. The control terminals of the first transistor pair (M1, M4) on the discharge path of the first and second sense nodes receive a first signal (RCLK) in common. The control terminals of the second transistor pair (M2, M5) of the discharge path of the first and second sense nodes receive in common a signal output from a first inverter (INV1) inverting the first signal (RCLK). The control terminals of the third transistor pair (M3, M6) of the discharge path of the first and second sense nodes respectively receive the second signal (CK) and a signal complementary to the second signal (/CK).

The charging paths for the first and second sense nodes (LSAT, LSAB) include two set of fourth, fifth and sixth transistors (MP1, MP2, MP3) and (MP4, MP5, MP6) connected in series between a second power supply (VDD1) and the first and second sense nodes (LSAT, LSAB), respectively.

The control terminals of the fourth transistor pair (MP1, MP4) on the charging path for the first and second sense nodes (LSAT, LSAB) receive in common a signal output from a second inverter (INV2) receiving a third signal (FCLK) which is an inverted version of the above mentioned first signal. The control terminals of the fifth transistor pair (MP2, MP5) on the charging path for the first and second sense nodes receive the third signal (FCLK) in common. The control terminals of the sixth transistor pair (MP3, MP6) receive the second signal (CK) and the complementary signal (/CK) of the second signal, respectively. The first to third transistor pairs are of the same conductivity type (nMOS), and the fourth to sixth transistor pairs are of the conductivity type (pMOS) opposite to that of the first to third pair transistors.

In one mode of the present invention, an equalization circuit (MP11, MP12 and MP13) that precharges and equalizes the first and second sense nodes (LSAT, LSAB) to a predetermined potential receives the first signal (RCLK) as a control signal. When the first signal (RCLK) is of a first value, the equalization circuit (MP11, MP12 and MP13) precharges/equalizes the first and second sense nodes (LSAT, LSAB). When the first signal (RCLK) is of a second value, the equalization circuit (MP11, MP12 and MP13) releases the precharging/equalization. The phase detection circuit further includes a differential amplifier circuit (AMP) and a latch circuit (L1). The differential amplifier circuit (AMP) has its differential input terminals connected to the first and second sense nodes (LSAT, LSAB). The latch circuit (L1) latches an output of the differential amplifier circuit (AMP). Exemplary embodiments of the present invention will now be described in detail.

FIG. 1 shows a configuration of a semiconductor device having a DLL (Delay Locked Loop) including a phase detection circuit according to the exemplary embodiment of the present invention.

The semiconductor device of the present exemplary embodiment includes a DLL circuit 1, a clock input terminal 2, an input buffer circuit 3 and an internal circuit 4.

The input buffer circuit 3 receives external clock signals CK and /CK (signal reverse-phased to CK) via an input terminal 2 from outside, and delivers internal clock signals RCLK_i, and FCLK_i (reverse-phased to RCLK) to the DLL circuit 1. The external clock signals CK and /CK supplied from outside to the clock input terminal 2, are supplied to a phase detection circuit 30 in the DLL circuit 1. The phase detection circuit 30 will be described subsequently.

The internal circuit 4 operates in response to the internal clock signals RCLK and FCLK, which are output signals of the DLL circuit 1.

The internal clock signals RCLK_i and FCLK_i are signals of a first amplitude (amplitude between VDD1 and VSS1). On the other hand, the external clock signals CK and /CK are signals of a second amplitude (amplitude between VDD2 and VSS2) smaller than the first amplitude. Though not limited thereto, the center of amplitude of the external clock signals CK and /CK is set so as to be approximately equal to the center of amplitude of the internal clock signal RCLK.

Since the amplitude of the external clock signals CK and /CK is smaller than that of the internal clock signals RCLK, as described above, VDD1 is higher in potential than VDD2, while VSS1 is lower in potential than VSS2.

The DLL circuit 1 includes a duty adjustment unit 10 that receives the internal clock signals RCLK_i and FCLK_i and adjusts their phase to output the resulting signals. The DLL circuit also includes a phase adjustment unit 20 that adjusts the phase of the internal clock signals RCLK_i, and FCLK_i, duty-adjusted by the duty adjustment unit 10, and that outputs internal clock signals RCLK, and FCLK (reverse-phased signal of RCLK). The DLL circuit also includes a phase detection circuit 30 that inputs the internal clock signals RCLK and FCLK and the external clock signals CK and /CK to detect the phase difference to output the result of phase detection as a phase adjustment signal LOUT to the phase adjustment unit 20. The DLL circuit also includes a duty decision unit 40 that detects the duty of the internal clock signals RCLK and FCLK, output from the phase adjustment unit 20, to output the result of duty detection as a duty adjustment signal to the duty adjustment unit 10. The DLL circuit further includes a DLL control unit uniy 100 that delivers a control signal to the duty detection circuit 30 and to the duty decision unit 40. The internal clock signal RCLK, output from the phase adjustment unit 20, is delivered via a buffer, not shown, to the internal circuit 50 of the semiconductor device carrying the DLL circuit 1 thereon.

The DLL control unit 100 delivers a reset signal Reset for a latch circuit to the phase detection circuit 30, by way of implementing one of DLL control functions.

Figure 2:
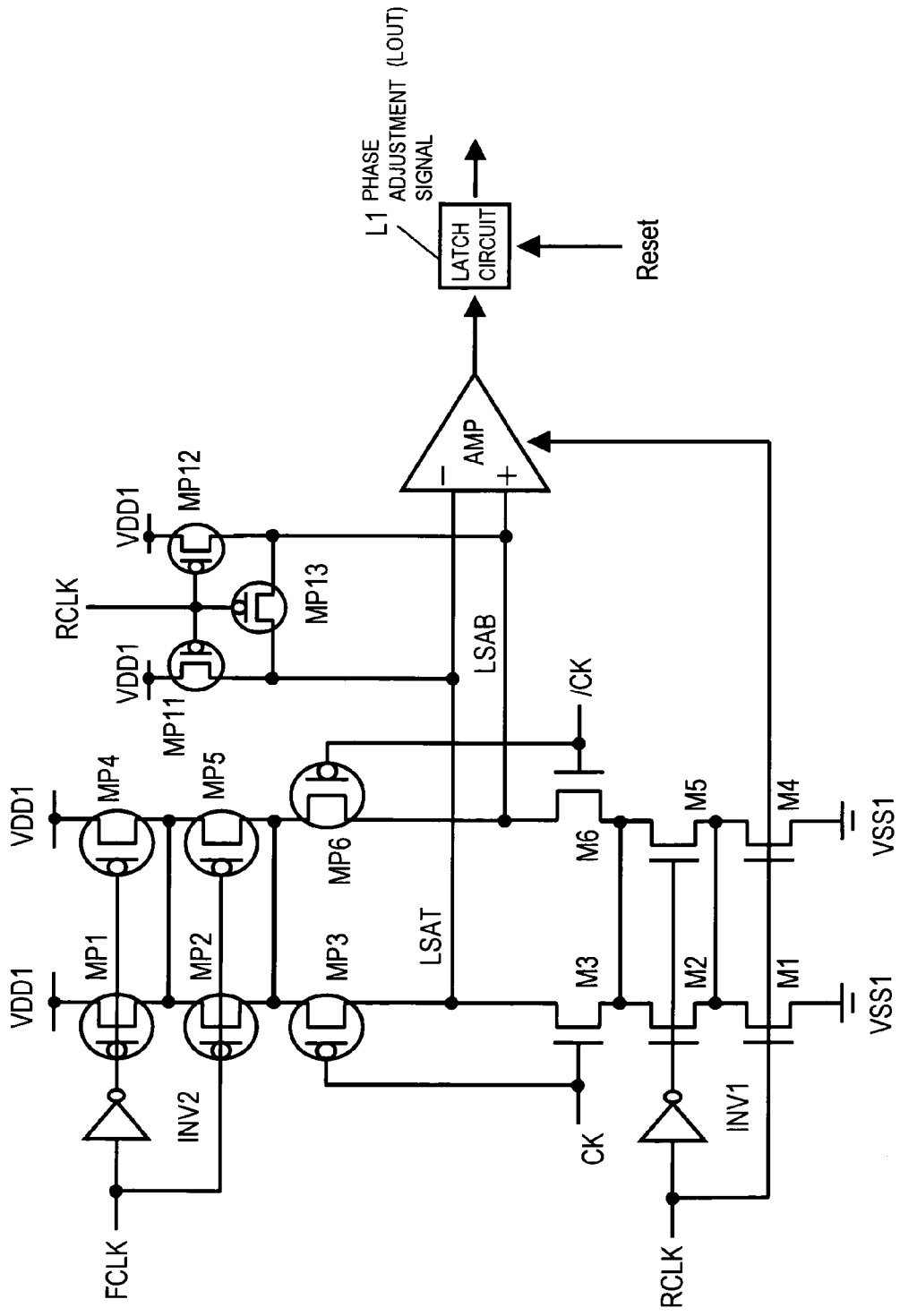
FIG. 2 is a circuit diagram showing a configuration of a phase detection circuit of the exemplary embodiment of the present invention.

FIG. 2 is a diagram showing an arrangement of the phase detection circuit 30. Referring to FIG. 2, the arrangement of the present exemplary embodiment includes, in addition to the discharging path (discharging circuit) for discharging the sense nodes LSAT and LSAB, configured for phase detection (M1 to M3 and M4 to M6), shown in FIG. 5, a charging path (charging circuit) (MP1 to MP3 and MP4 to MP6), that charges the sense nodes LSAT and LSAB configured for phase detection.

By this configuration, it is possible with the present exemplary embodiment to enlarge the potential difference between the sense nodes LSAT and LSAB at the end of the sampling period. As a result, it is possible in the present exemplary embodiment to prevent mistaken amplification in the differential amplifier or to suppress the sense time (phase difference detection time) from increasing, without protracting the sampling time, such as to provide a phase detection circuit of high accuracy.

Referring to FIG. 2, the phase detection circuit of the present exemplary embodiment includes nMOS transistors M1 and M4, which have sources are connected to a low potential power supply VSS1, gates supplied with the internal clock signal RCLK in common and drains connected together;

an inverter INV1 (delay time=td1) that receives the internal clock signal RCLK and that outputs an inverted signal thereof;

nMOS transistors M2 and M5 which have coupled sources connected to coupled drains of the nMOS transistors M1 and M4 which have gates input an output signal of the inverter INV1 in common, and whose drains are connected together;

nMOS transistors M3 and M6 which have coupled sources connected to the coupled drains of the nMOS transistors M2 and M5 con, gates supplied with the external clock signal CK and the external clock signal /CK which is reverse-phased or complementary to the external clock signal CK, and drains connected to the nodes (sense nodes) LSAT and LSAB, respectively;

an inverter INV2 (delay time=td1) that receives the internal clock signal FCLK and outputs an inverted signal thereof;

pMOS transistors MP2 and MP5 which have coupled sources connected to the coupled drains of the pMOS transistors MP1 and MP4, gates supplied with the internal clock signal FCLK in common, and drains coupled together;

pMOS transistors MP3 and MP6 which have coupled sources connected to the coupled drains of the pMOS transistors MP2 and MP5, gates supplied with the external clock signal CK and the external clock signal /CK which is reverse-phased to the external clock signal CK, and drains connected to the sense nodes LSAT and LSAB, respectively;

pMOS transistors MP11 and MP12 which have sources connected to the high potential power supply VDD1, gates supplied with the internal clock signal RCLK in common, and drains connected to the sense nodes LSAT and LSAB, respectively;

a PMOS transistor MP13 that is connected between the drains of the pMOS transistors MP11 and MP12 and has a gate supplied with the internal clock signal RCLK;

a differential amplifier AMP, also termed a sense amplifier, that has an inverting input terminal and a non-inverting input terminal connected to the sense nodes LSAT and LSAB, respectively; and a latch circuit L11 that latches an output (single-ended output) of the sense amplifier AMP to output the so latched signal as a phase adjustment signal LOUT. In the terms 'sense nodes LSAT and LSAB, T and B stand for True and Bar. That is, these sense nodes transmit a signal differentially.

The latch circuit L1 is reset by a reset signal Reset from the DLL control unit 100 (FIG. 1).

The latch circuit L1 may be composed by an SR latch which is reset by a reset signal Reset from the DLL control unit 100 (FIG. 1) before the start of the operation of phase detection, that is, before the sampling period, so that its output is set to Low level (VSS1). If, as a result of phase detection, the output of the sense amplifier AMP is High (VDD1), the output is set to High level (VDD1). This configuration is given only by way of illustration such that it is not to be interpreted restrictively. The latch circuit L1 may be set to High level (VDD1) when reset by the reset signal Reset. Or, latch circuit L1 may not be composed by the SR latch and may be configured to latch an output of the sense amplifier AMP at a predetermined latch timing.

The internal clock signal FCLK is reverse-phased or complementary to the internal clock signal RCLK, and falls from the High level to the Low level for the rise of RCLK from the Low level (VSS1) to the High level (VDD1). In the following, RCLK and FCLK are sometimes referred to as first and second internal clock signals, respectively.

The inverter INV1 delays the first internal clock signal RCLK with a delay time td1 and inverts the logic level of the first clock signal RCLK to supply the resulting signal to the gates of the nMOS transistors M2 and M5, respectively.

The inverter INV2 delays the second internal clock signal FCLK with the same delay time td1 as that of the first internal clock signal RCLK. The inverter INV2 also inverts the logic level of the second internal clock signal FCLK to supply the resulting signal to the gates of the pMOS transistors MP1 and MP4. That is, the rise timing of the first internal clock signal RCLK is substantially the same as the fall timing of the second internal clock signal FCLK, so that the nMOS transistors (M1, M4) and the pMOS transistors (MP1, MP4) are made conductive substantially simultaneously and the nMOS transistors (M2, M5) and the pMOS transistors (MP2, MP5) are made conductive substantially simultaneously.

The source potentials of the nMOS transistors M3 and M6 are common. That is, the coupled sources of the nMOS transistors M3 and M6 are connected to the coupled drains of the nMOS transistors M2 and M. The nMOS transistors M3 and M6 are made conductive in case their gate-to-source voltages are not less than a threshold voltage.

The amplitude of the external clock signal CK and /CK is smaller than that of the internal clock signals RCLK and FCLK. Hence, if the nMOS transistors M1 to M6 are fabricated to have the size corresponding to the amplitude of the internal clock signal RCLK, in short, if the threshold voltages of the nMOS transistors M1 to M6 are set to have a value corresponding to the power supply voltages VDD1, and VSS1, the gate-to-source voltages of the nMOS transistors M3 and M6 which receive the external clock signals CK and /CK, at gates thereof, respectively, do not become smaller than the threshold value even when the external clock signal CK or /CK assumes Low level (VDD2). Hence, the nMOS transistors M3 and M6 are both made conductive. In this case, the current that flows through one of the nMOS transistors M3 and M6 receiving one of the external clock signals CK and /CK of the High level (VDD2) at its gate becomes larger than the current that flows through the other transistor receiving the external clock signal of the Low level (VSS2) at its gate. The reason for this is that the gate-to-source voltage of the one of the nMOS transistors M3 and M6 receiving the High level (VDD2) of the external clock signal at its gate becomes larger than the gate-to-source voltage of the other transistor receiving the Low level (VSS2) of the external clock signal at its gate. On the other hand, in case one of the nMOS transistors M3 and M6 that receives the external clock signal of the High level (VDD2) at its gate is in a conduction state, the other transistor receiving the Low level external clock signal (VSS2) may be made non-conductive, depending on the size of the nMOS transistors M1 to M6, and the amplitude and the common voltage of the external clock signals CK and /CK differential transmitted.

In similar manner, if the transistors MP1 to MP6 are fabricated to have the size corresponding to the amplitude of the internal clock signals FCLK, in short, if the pMOS transistors MP1 to MP6 are set to have a threshold voltage corresponding to the power supply voltages VDD1 and VSS1, the pMOS transistors MP3 and MP6, which receive the external clock signals CK and /CK at gates thereof, are both made conductive. In this case, the current that flows through one of the pMOS transistors MP3 and MP6 receiving one of the external clock signals CK and /CK having the Low level (VSS2) at its gate, becomes larger than the current that flows through the other transistor receiving the High level (VDD2) at its gate. On the other hand, in case one of the pMOS transistors MP3 and MP6 that receives the external clock signal of the Low level (VSS2) at its gate is in conduction state, the other transistor receiving the High level external clock signal (VDD2) at its gate may be made non-conductive, depending on the size of the pMOS transistors MP1 to MP6, and the amplitude and the common voltage of the external clock signals CK and /CK differentially transmitted.

In the following explanation of the present exemplary embodiment, the case where both the nMOS transistors M3 and M6 are in a conduction state and both the pMOS transistors MP3, MP6 are in a conduction state, is taken as an example.

The sense node LSAT is connected to a connection node of the drain of the nMOS transistor M3 that receives the external clock signal CK at its gate and the drain of the pMOS transistor MP3. The sense node LSAB is connected to a connection node of the drain of the nMOS transistor M6 that receives the reverse-phase external clock signal /CK at its gate and the drain of the pMOS transistor MP6.

In the present exemplary embodiment, in order to prevent the sense nodes LSAT and LSAB from being stuck at the power supply potential VDD1, namely, to provide for the current driving capability of the nMOS transistors M3 and M6 larger than that of the pMOS transistors MP3 and MP6 even in case the external clock signals CK and /CK are at Low level, the W size (gate width) Wn of the nMOS transistor is set so as to be smaller than the W size Wp of the pMOS transistor. By so doing, the current driving capability on the discharging side may be set so as to be larger than that on the charging side. More specifically, in the present exemplary embodiment, the PN ratio of the pMOS transistors MP1 to MP6 and the nMOS transistors M1 to M6 is set to 2.6, the W size Wn of the nMOS transistors M1 to M6 is set to 6 μm and the W size Wp of the pMOS transistors MP1 to MP6 is set to 9 μm. The PN ratio denotes the number of times the W size Wp of the pMOS transistor is to be as large as the W size Wn of the nMOS transistor in order to equalize the current driving capability of the pMOS transistor and that of the nMOS transistor. For example, if, with the PN ratio of 2.6, it is desired to fabricate a pMOS transistor of the driving capability equivalent to that of the nMOS transistor with the W size Wn of 1 μm, the W size Wp of the pMOS transistor needs to be set at 2.6 μm. In the present exemplary embodiment, the W size Wp of the pMOS transistor MP1 to MP6 is set to 1.5 times as large as the W size Wn of the nMOS transistors M1 to M6. Such value is smaller than the PN ratio (2.6) in the present exemplary embodiment. Thus, in the present exemplary embodiment, the current driving capability of the nMOS transistor is set so as to be larger than that of the pMOS transistor.

Figure 5:
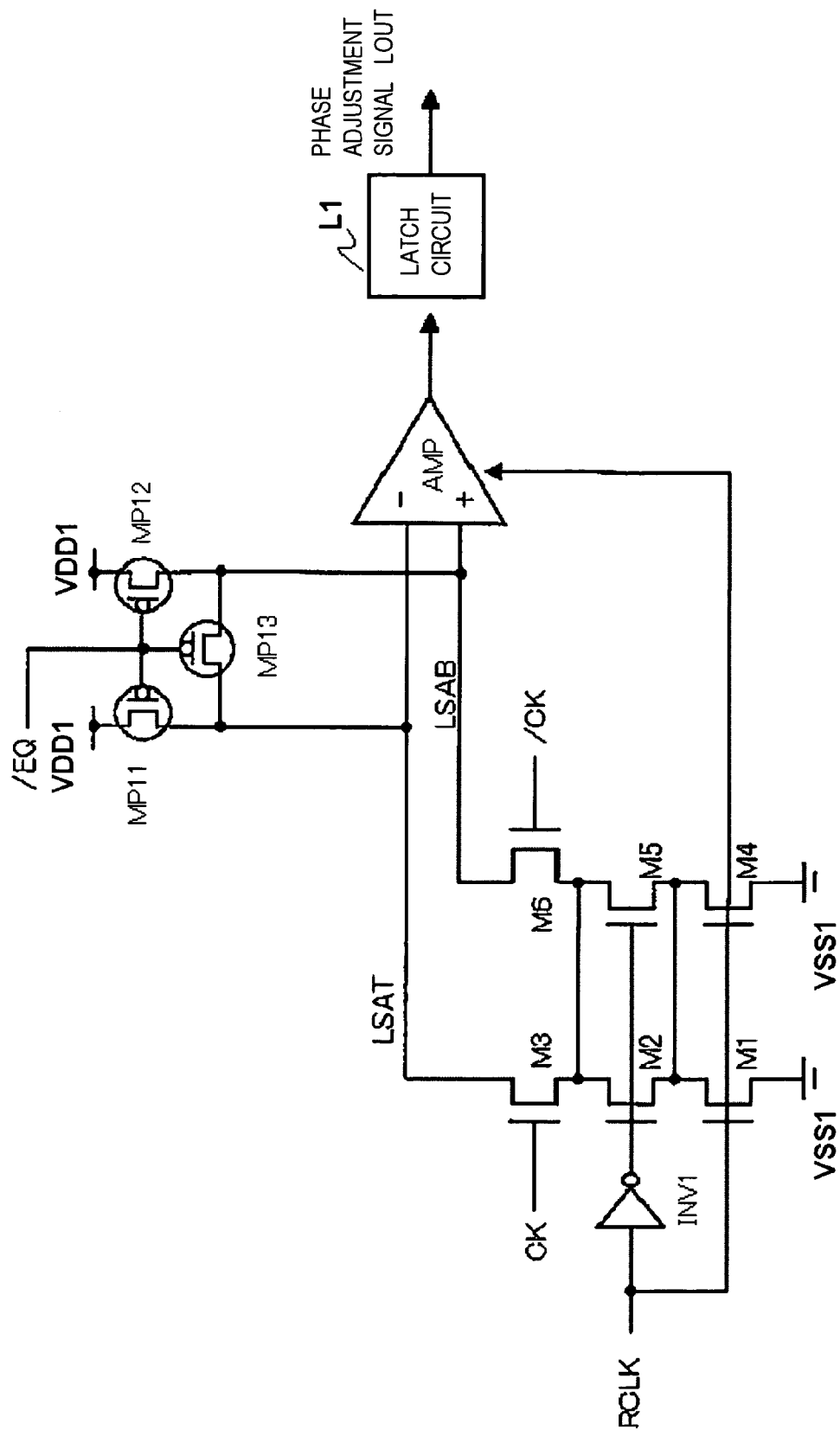
FIG. 5 is a circuit diagram showing a configuration of a phase detection circuit of a related technique.

In the configuration of FIG. 5, a dedicated equalization signal /EQ is supplied to the gates of the pMOS transistors MP11 to MP13 that compose the equalization circuit. In the configuration of FIG. 2, an internal clock signal RCLK is applied to the gates of the pMOS transistors MP11 to MP13 that compose the equalization circuit. The sense nodes LSAT and LSAB are precharged/equalized at the power supply potential VDD1 in case the internal clock signal RCLK is Low level (VSS1). The precharging and equalization are cancelled in case the internal clock signal RCLK is High level (VDD1).

In the present exemplary embodiment, as in FIG. 5, the High level (VDD1) is applied to the gates of the nMOS transistors M1, M4, M2, and M5 during the sampling period of delay time td1 from the rise of the first internal clock signal RCLK. This causes the nMOS transistors N1, M4, M2, M5 to be made conductive. During this sampling period, the nMOS transistors M3 and M6 are both made conductive. The current flowing through the transistor M3 or M6 corresponding to the external clock signal CK or /CK at the High level (VDD2) becomes larger than that flowing through the transistor M6 or M3 corresponding to the external clock signal CK or /CK at the Low level (VSS2). Hence, more current is discharged from one of the sense nodes LSAT and LSAB connected to one of the transistors M3 and M6 corresponding to the external clock signal CK or /CK at the High level (VDD2).

The Low level (VSS1) is applied to the gate of each of the pMOS transistors MP1, MP4, MP2 and MP5 during the sampling period of the delay time td1 of the inverter INV2 from the falling of the second internal clock signal FCLK (hence, from the time of rising of the first internal clock signal RCLK). Hence, the pMOS transistors MP1, MP4, MP2 and MP5 are made conductive. During this sampling period, corresponding to the sampling period of the time width td1 from the rise of the first internal clock RCLK, the pMOS transistors MP3 and MP6 are both made conductive. The current flowing through the transistor MP3 or MP6 corresponding to the external clock signal CK or /CK at the Low level (VSS2) becomes larger than that flowing through the pMOS transistor MP6 or MP3 corresponding to the external clock signal CK or /CK at the High level (VDD2). Hence, more current is charged on one of the sense nodes LSAT and LSAB connected to the pMOS transistor MP3 or MP6 corresponding to the external clock signal CK or /CK at the Low level (VSS2).

For example, if, during the sampling period, the external clock signal CK is at High level (VDD1) and the reverse-phase external clock signal /CK is at Low level (VSS2), the nMOS transistor M3 is made conductive with the first current driving capability. The nMOS transistor M6 is made conductive with the second current driving capability smaller than the first current driving capability. On the other hand, the pMOS transistor MP3 is made conductive with the third current driving capability, while the pMOS transistor MP6 is made conductive with the fourth current driving capability greater than the third current driving capability. Even in case the external clock signals CK or /CK is set to Low level (VSS2), the current driving capability of the nMOS transistors M3 and M6 is greater than that of the pMOS transistors MP3 and MP6, and hence the second current driving capability is greater than the fourth current driving capability.

Hence, the discharge amount from the sense node LSAT is more than that from the sense node LSAB, thus causing the differential potential between the node LSAT and the node LSAB (LSAT>LSAB).

That is, if the rise from the Low level (VSS2) to the High level (VDD2) of the external clock signal CK is temporally ahead of the rise from the Low level (VSS1) to the High level (VDD1) of the first internal clock signal RCLK, the discharge amount of the sense node LSAT is more than that of the sense node LSAB. After the end of the sampling period, the output of the sense amplifier AMP is set to High level, whereas the phase adjustment signal LOUT, output from the latch circuit L1, is set to High level.

If, during the sampling period, the external clock signal CK is at Low level (VSS2), and the reverse-phase external clock signal /CK is at High level (VDD2), the nMOS transistor M3 is made conductive with the second current driving capability, while the nMOS transistor M6 is made conductive with the first current driving capability. The pMOS transistor MP3 is made conductive with the fourth current driving capability, while the pMOS transistor MP6 is made conductive with the third current driving capability.

Hence, the discharge amount of the sense node LSAT is less than that of the sense node LSAB, thus producing a difference in potential between the potentials of the sense nodes LSAT and LSAB (LSAT>LSAB).

That is, if the rise from the Low level (VSS2) to the High level (VDD2) of the external clock signal CK is temporally in rear of the rise from the Low level (VSS1) to the High level (VDD1) of the first internal clock signal RCLK, the sense node LSAT discharges less current than the sense node LSAB. After the end of the sampling period, the output of the sense amplifier AMP is brought Low level, whereas the phase adjustment signal LOUT, output from the latch circuit L1, is kept at reset state, namely, at Low level.

Figure 3:
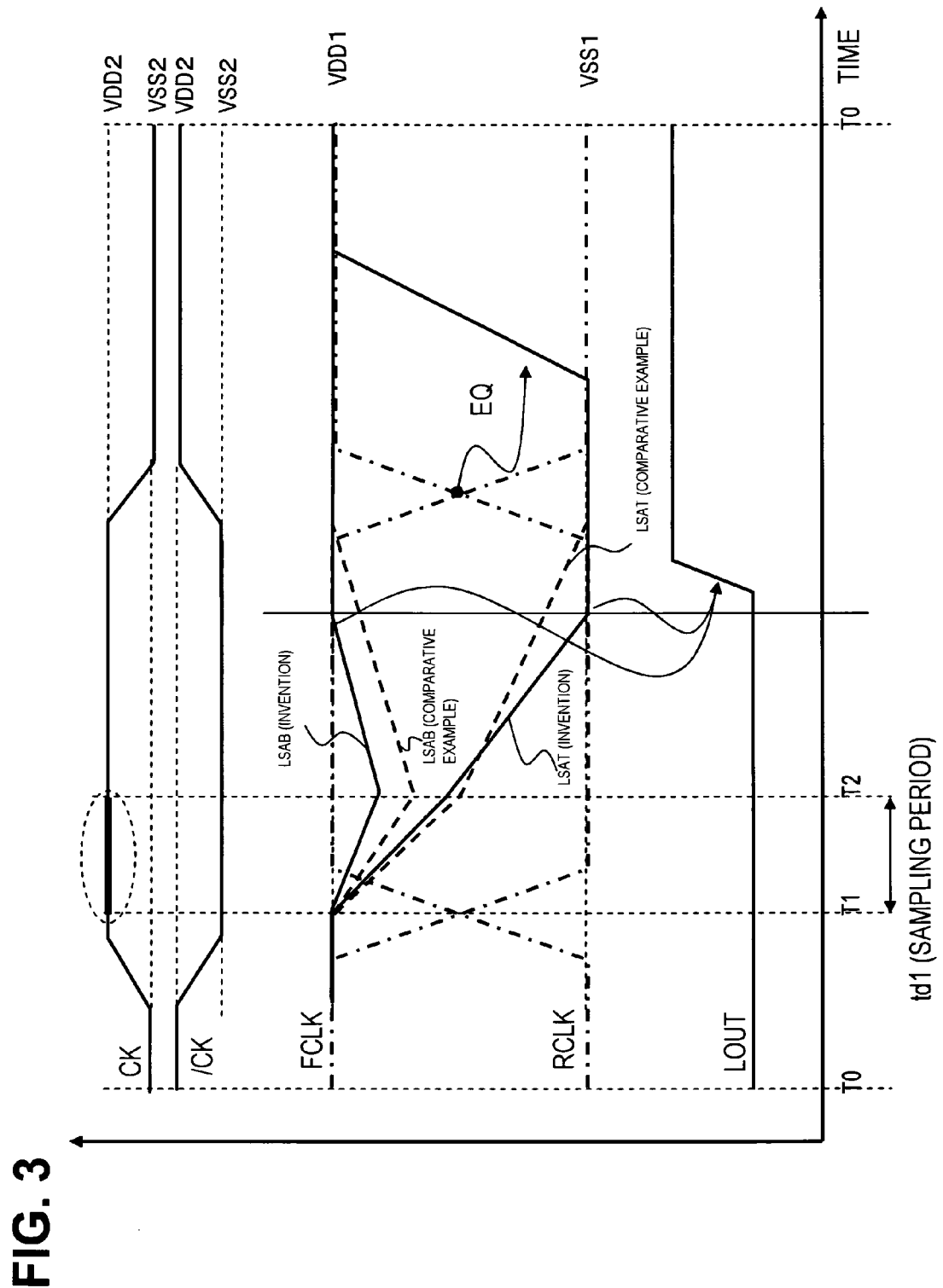
FIG. 3 is a waveform diagram showing a typical operation of a phase detection circuit of the exemplary embodiment of the present invention.

FIG. 3 is a waveform diagram for explaining a typical operation of the circuit shown in FIG. 2. Specifically, FIG. 3 shows voltage waveforms of CK and /CK, FCLK, RCLK, LSAT, LSAB and LOUT of FIG. 2. LOUT is a phase adjustment signal output from the latch circuit L1. In FIG. 3, a time interval [T1, T2] represents a sampling period that begins with the rise of the first internal clock signal RCLK and that is prescribed by the delay time td1 of the inverter INV1. Meanwhile, FIG. 3 shows operational waveforms for a case where the phase of the external clock signal CK leads that of the first internal clock signal RCLK. During the sampling period [T1, T2], the external clock signal CK is kept at High level, whereas the reverse-phase external clock signal /CK is kept at Low level.

The operation of phase detection is initiated in synchronism with the rise of the first internal clock signal RCLK (sampling period). After the end of the sampling period, the differential voltage between the sense nodes LSAT and LSAB is amplified by the sense amplifier AMP. The signal LOUT that has been reset to Low level, is set to High level.

In FIG. 3, broken lines for the voltage waveforms of the sense nodes LSAT and LSAB schematically show voltage waveforms at the sense nodes LSAT and LSAB in case of using the circuit of FIG. 5 (related art) by way of a Comparative Example. In FIG. 3, solid lines denote the voltage waveforms of the sense nodes LSAT and LSAB for the exemplary embodiment of the present invention.

If, during the sampling period, the external clock signal CK is High level (VDD2), the potential at the sense node LSAB begins to fall from the start time point of the sampling period at T1. In the present exemplary embodiment, the amount of voltage drop for the sense node LSAB at an end point T2 of the sampling period is small as compared with that of the waveform of the Comparative Example, indicated by a broken line. At an end point T2 of the sampling period, the potential at the sense node LSAB in the present embodiment, as indicated by a solid line is closer to the High potential side (VDD1 side).

The potential at the sense node LSAT also begins to descend from the start time point of the sampling period of timing T1. At the timing T2, the potential at the sense node LSAT is closer to the High level potential (VDD1) side than the waveform of the Comparative Example indicated by a broken line.

The potential at the sampling node LSAB of Comparative Example is changed with the current driving capability of the nMOS transistor M6 in case the gate voltage is the Low level (VSS2) of the external clock signal /CK (second current driving capability). On the other hand, the potential at the sampling node LSAB of the present exemplary embodiment is changed with the difference between the current driving capability of the nMOS transistor M6 (second current driving capability) in case the gate voltage is the Low level (VSS2) of the external clock signal /CK and the current driving capability of the pMOS transistor MP6 (fourth current driving capability) in case the gate voltage is the Low level (VSS2) of the external clock signal /CK.

On the other hand, the potential at the sampling node LSAT of Comparative Example is changed with the current driving capability of the nMOS transistor M3 (first current driving capability) in case the gate voltage is the High level (VDD2) of the external clock signal CK. The potential at the sampling node LSAT of the exemplary embodiment is changed with the difference between the current driving capability of the nMOS transistor M3 (first current driving capability) in case the gate voltage is the High level (VDD2) of the external clock signal CK and the current driving capability of the pMOS transistor MP6 (third current driving capability) in case the gate voltage is the High level (VDD2) of the external clock signal CK.

In the present exemplary embodiment, the sizes of the pMOS transistor and the nMOS transistor are set so that, even in case the external clock signals CK and /CK are Low level, the current driving capability of the nMOS transistors M3 and M6 will be larger than that of the pMOS transistors MP3 and MP6. Hence, the large/small relationship among the first to fourth current driving capabilities may be expressed by the first current driving capability, second current driving capability, third current driving capability and the fourth current driving capability, arranged in the decreasing sequence.

Thus, at the end of the sampling period, the difference in the potential between the sense nodes LSAT and LSAB of the present exemplary embodiment is more enlarged in comparison with that in the Comparative Example. Specifically, the difference in the potential between the potential at the sense node LSAT and that at the sense node LSAB is greater than that in the Comparative Example by an amount corresponding to the difference between the fourth current driving capability and the third current driving capability. In the case of FIG. 3, the potential at the sense node LSAT is lower than that at the sense node LSAB at the end of the sampling period at timing T2. The phase adjustment signal LOUT is set to High level as a result of differential amplification by the sense amplifier AMP.

Figure 4:
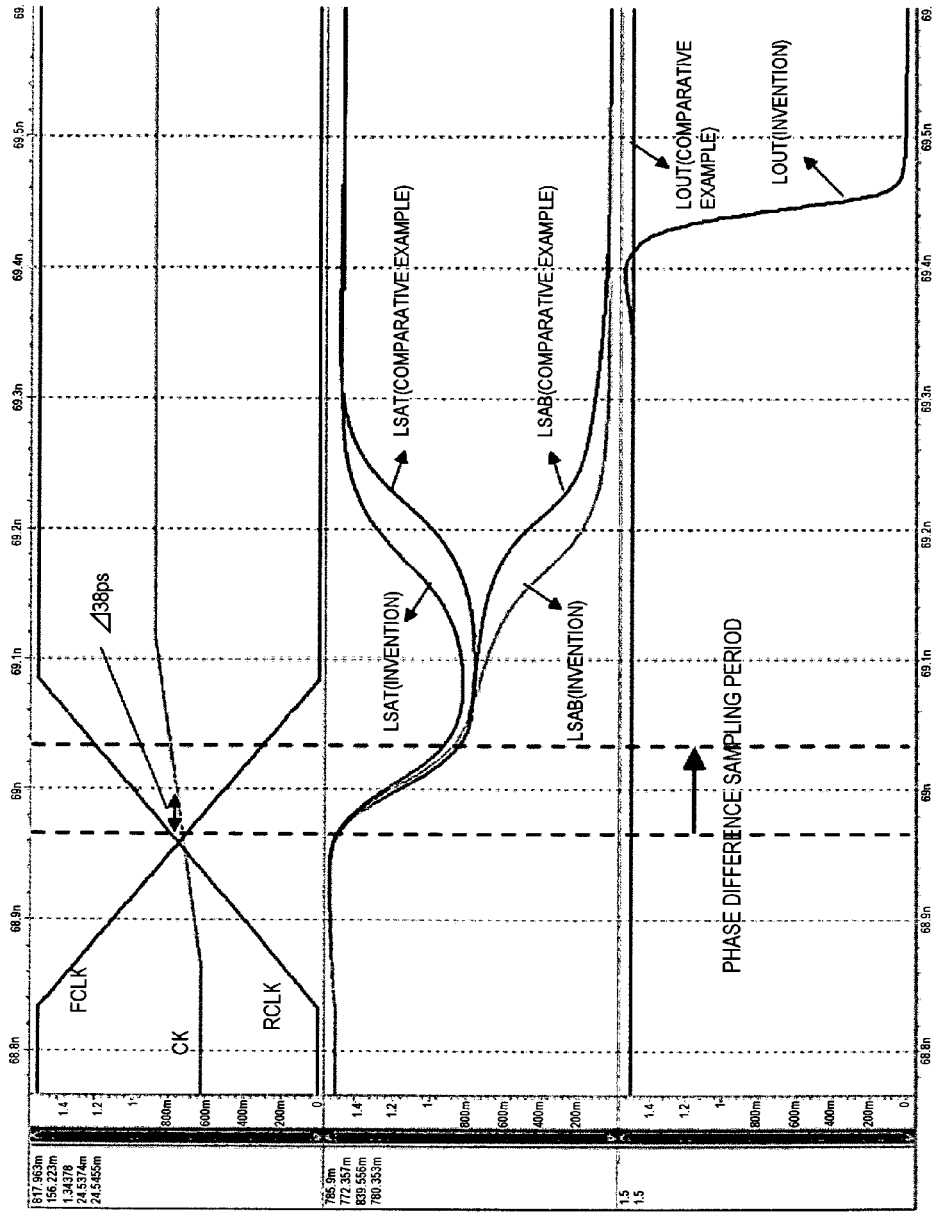
FIG. 4 is a waveform diagram showing the result of circuit simulation of the phase detection circuit of the exemplary embodiment of the present invention.

FIG. 4 shows the result of simulation of the operation of the related technique of FIG. 5 and a phase detection circuit of the present exemplary embodiment in case the external clock signal CK has a phase lag from the first internal clock signal RCLK. In the exemplary embodiment of FIG. 4, the first internal clock signal RCLK rises at a time point earlier by about 38 ps (picoseconds) than the rise of the external clock signal CK. In FIG. 4, the slew rate of the first internal clock signal RCLK (delay in signal rising) is higher than that of the external clock signal CK of the lower amplitude. The timing at which the first internal clock signal RCLK of the rising waveform gets to the amplitude center thereof is 38 ps ahead of the timing at which the external clock signal CK of the rising waveform gets to the amplitude center thereof. Hence, the phase adjustment signal LOUT is expected to be Low level. That is, in case the rise of the external clock signal CK lags behind the rise of the first internal clock signal RCLK, the large/small relationship between the potential at the LSAT and that at the LSAB should be such that LSAB<LSAT, with the output OUT of the sense amplifier AMP being Low.

However, in Comparative Example, the initial difference in potential between the potential at the LSAT and that on the LSAB before amplification by the differential amplifier, namely the potential difference at the end time point of the sampling period, is inverted in sequence, such that LSAB>LSAT, as shown in FIG. 4. While the potential difference should be such that LSAB<LSAT, (potential at $LSAT$)−(potential at $LSAB$)=−13.5 mV, the large/small relationship between the potential at the LSAT and that at the LSAB is reversed. As a result, the phase adjustment signal LOUT goes High indicating an error in decision. See LOUT of FIG. 4 (Comparative Example). In the simulation of FIG. 5, the latch circuit L1 of FIG. 2 has its output reset to High level by the reset signal Reset before the operation for phase detection.

In the exemplary embodiment of the present invention, as contrasted to the Comparative Example, the initial difference in potential between the potential on the sense node LSAT and that on the sense node LSAB (potential difference at the end of the sampling period) is enlarged towards the VSS and VDD sides, as shown in FIG. 4. Specifically, (potential on LSAT)−(potential on LSAB)=59.2 mV is obtained. Hence, a Low level output may be obtained as LOUT, in keeping with LSAT>LSAB, as expected. See LOUT (invention) of FIG. 4. According to the present invention, the 'dead zone' of the phase detection circuit has been diminished.

The meritorious operation and effect of the present invention will now be described.

In the phase detection circuit, the initial differential potential for phase sampling may be increased, thus providing for high precision in phase detection.

By increasing the initial differential potential, the sampling period may be shorter, thus decreasing the 'dead zone' of phase detection.

In the configuration of FIG. 2, it is of course possible to interchange the row of the pMOS transistors MP1 and MP4 and the row of the pMOS transistors MP2 and MP5 which are shown cascode-connected. It is also of course possible to interchange the row of the nMOS transistors M1 and M4 and the row of the nMOS transistors M2 and M5 which are shown cascode-connected.

Figure 6:
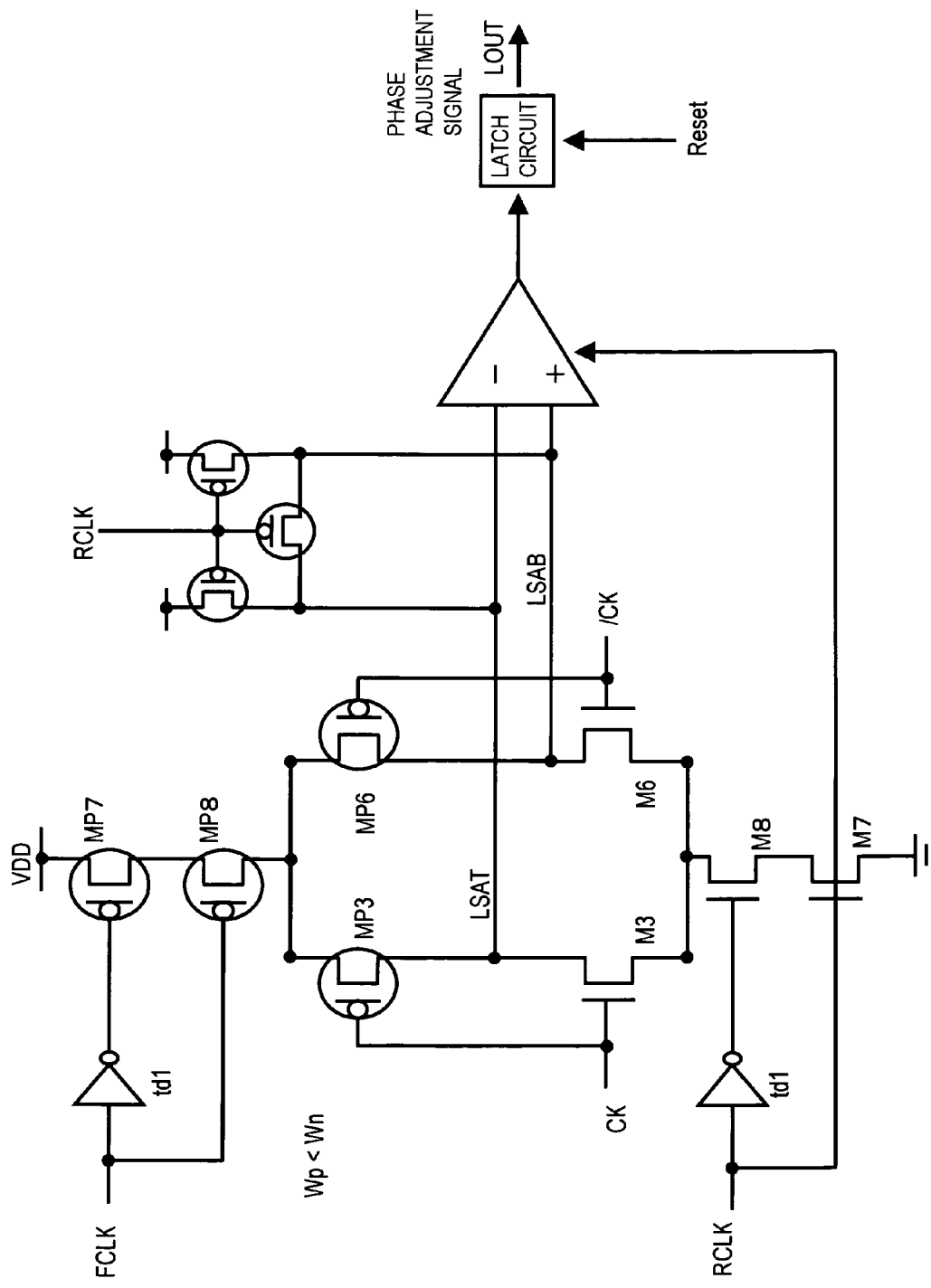
FIG. 6 is a circuit diagram showing a configuration of a phase detection circuit according to another exemplary embodiment of the present invention.

Also, in the configuration of FIG. 2, the nMOS transistors M1, M4, M2 and M5 and the pMOS transistors MP1, MP4, MP2 and MP5 are configured as separate transistors. Alternatively, such a configuration may be used in which an nMOS transistor M7 is used in place of the nMOS transistors M1 and M4, an nMOS transistor M8 is used in place of the nMOS transistors M2 and M5, a pMOS transistor MP7 is used in place of the pMOS transistors MP1 and MP4 and a pMOS transistor M8 is used in place of the pMOS transistors MP2 and MP5. This configuration is shown in FIG. 6.

In the above exemplary embodiment of the present invention, a precharge potential is the power supply potential VDD1. However, the precharge potential may also be a potential different from the power supply potential VDD1. For example, if the precharge potential is set to approximately one-half of the power supply potential VDD1 (½ VDD1), it becomes unnecessary to take into account the sense nodes LSAT, LSAB being stuck at the power supply potential VDD1, such that it is possible to increase the W size of the pMOS transistors MP1 to MP6.

Figure 7:
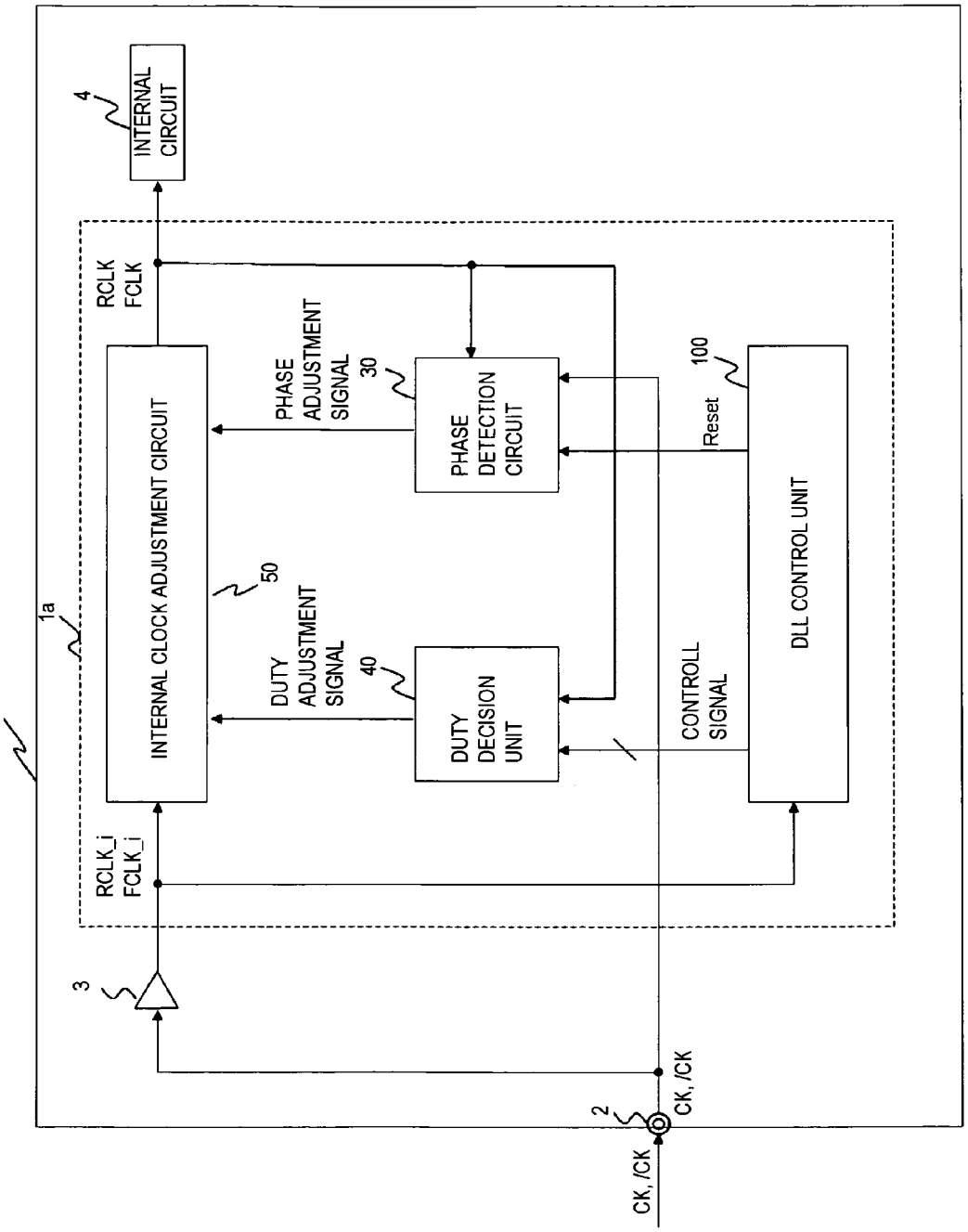
FIG. 7 is a block diagram showing the configuration of a DLL circuit according to another exemplary embodiment of the present invention.

FIG. 7 is a diagram showing the configuration of another exemplary embodiment of the present invention. In the configuration of FIG. 1, the DLL circuit 1 provided in a semiconductor device, includes the duty adjustment unit 10 and the phase adjustment unit 20 separately each other. However, as shown in FIG. 7, the DLL circuit 1a includes an internal clock adjustment circuit 50 in place of the duty adjustment unit 10 and the phase adjustment unit 20. The internal clock adjustment circuit 50 operates to adjust phases and values of the duty ratio of internal clock signals RCLK_i, and FCLK_i in accordance with both the duty adjustment signal supplied from the duty decision unit 40 and the phase adjustment signal supplied from the phase detection signal 30 to output the resulting complementary internal clock signals RCLK and FCLK.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

What is claimed is:

1. A device comprising:
   first and second power lines;
   first and second sense nodes;
   a first circuit unit comprising:
      first and second transistors complementary in conductivity type to each other and coupled to each other at the first sense node, and
      third and fourth transistors complementary in conductivity type to each other and coupled to each other at the second sense node,
      the first and second transistors receiving a first clock signal at control electrodes thereof, the third and fourth transistors receiving a second clock signal at control electrodes thereof, and the second clock signal being complementary in phase to the first clock signal,
   a second circuit unit coupled between the first power line and the first circuit unit, and configured to respond to a third clock signal;
   a third circuit unit coupled between the second power line and the first circuit unit, and configured to respond to a fourth clock signal that is complementary in phase to the third clock signal; and
   a fifth transistor coupled between the first and second sense nodes.

2. The device as claimed in claim 1, wherein the fifth transistor receives third clock signal at a control electrode thereof.

3. The device as claimed in claim 1, wherein each of the first and second clock signals is smaller in amplitude than each of the third and fourth clock signals.

4. The device as claimed in claim 1, further comprising an amplifier coupled to the first sense node at a first input node thereof and to the second sense node at a second input node thereof.

5. The device as claimed in claim 4, wherein the amplifier receives the third clock signal.

6. The device as claimed in claim 4, further comprising a latch circuit coupled to the amplifier circuit.

7. The device as claimed in claim 1, wherein the second circuit unit includes sixth and seventh transistors coupled in series between the first power line and the first circuit unit, and the third circuit unit includes eighth and ninth transistors coupled in series between the second power line and the first circuit unit.

8. The device as claimed in claim 1, wherein the fifth transistor is formed independently of the first, second, third and fourth transistors.

9. The device as claimed in claim 1, wherein the second circuit unit comprises:
   a first subcircuit including sixth and seventh transistors coupled in series between the first power line and the first circuit unit; and
   a second subcircuit including eighth and ninth transistors coupled in series between the first power line and the first circuit unit, and
   wherein the third circuit unit comprises:
   a third subcircuit including tenth and eleventh transistors coupled in series between the second power line and the first circuit unit; and
   a fourth subcircuit including twelfth and thirteenth transistors coupled in series between the second power line and the first circuit unit.

10. The device as claimed in claim 6, as comprising a phase detection circuit in a DLL (Delay Locked Loop) circuit, wherein the latch circuit provides a phase adjustment signal as an output signal thereof and wherein the latch circuit receives a reset signal from a DLL control unit in the DLL circuit.

11. A device comprising:
   first and second power lines;
   first and second sense nodes;
   an amplifier having input terminals respectively connected to the first and second sense nodes;
   a first circuit unit comprising:
      first and second transistors complementary in conductivity type to each other and coupled to each other at the first sense node, and
      third and fourth transistors complementary in conductivity type to each other and coupled to each other at the second sense node,
      the first and second transistors receiving a first clock signal at control electrodes thereof, the third and fourth transistors receiving a second clock signal at control electrodes thereof, and the second clock signal being complementary in phase to the first clock signal,
   a second circuit unit coupled between the first power line and the first circuit unit, and configured to respond to a third clock signal;
   a third circuit unit coupled between the second power line and the first circuit unit, and configured to respond to a fourth clock signal that is complementary in phase to the third clock signal; and
   a fifth transistor coupled between the first and second sense nodes.

12. The device as claimed in claim 11, wherein the second circuit unit comprises:
   a first subcircuit including sixth and seventh transistors coupled in series between the first power line and the first circuit unit; and
   a second subcircuit including eighth and ninth transistors coupled in series between the first power line and the first circuit unit, and wherein the third circuit unit comprises:
a third subcircuit including tenth and eleventh transistors coupled in series between the second power line and the first circuit unit; and
a fourth subcircuit including twelfth and thirteenth transistors coupled in series between the second power line and the first circuit unit.

13. The device as claimed in claim 11, further comprising a latch circuit coupled to the amplifier circuit.

14. The device as claimed in claim 13, as comprising a phase detection circuit in a DLL (Delay Locked Loop) circuit, wherein the latch circuit provides a phase adjustment signal as an output signal thereof and wherein the latch circuit receives a reset signal from a DLL control unit in the DLL circuit.

15. A semiconductor apparatus, comprising:
a clock terminal to receive an external clock signal;
a DLL (Delay Locked Loop) circuit that generates an internal clock signal synchronized with the external clock signal; and
an internal circuit that uses the internal clock signal to perform an operation synchronized with the external clock signal,
wherein the DLL circuit comprises a phase detection circuit comprising:
first and second power lines;
first and second sense nodes;
a first circuit unit comprising:
first and second transistors complementary in conductivity type to each other and coupled to each other at the first sense node; and
third and fourth transistors complementary in conductivity type to each other and coupled to each other at the second sense node,
the first and second transistors receiving a first clock signal at control electrodes thereof, the third and fourth transistors receiving a second clock signal at control electrodes thereof, and the second clock signal being complementary in phase to the first clock signal,
a second circuit unit coupled between the first power line and the first circuit unit, and configured to respond to a third clock signal;
a third circuit unit coupled between the second power line and the first circuit unit, and configured to respond to a fourth clock signal that is complementary in phase to the third clock signal; and
a fifth transistor coupled between the first and second sense nodes.

16. The semiconductor apparatus as claimed in claim 15, wherein the internal circuit comprises a synchronous memory.

17. The semiconductor apparatus as claimed in claim 16, wherein the synchronous memory comprises a DDR (Double Data Rate) memory.

18. The semiconductor apparatus as claimed in claim 15, wherein the second circuit unit comprises:
a first subcircuit including sixth and seventh transistors coupled in series between the first power line and the first circuit unit; and
a second subcircuit including eighth and ninth transistors coupled in series between the first power line and the first circuit unit,
and wherein the third circuit unit comprises:
a third subcircuit including tenth and eleventh transistors coupled in series between the second power line and the first circuit unit; and
a fourth subcircuit including twelfth and thirteenth transistors coupled in series between the second power line and the first circuit unit.

19. The semiconductor apparatus as claimed in claim 15, wherein the DLL circuit further comprises:
an amplifier having input terminals respectively connected to the first and second sense nodes; and
a latch circuit coupled to an output of the amplifier circuit.

20. The semiconductor apparatus as claimed in claim 19, wherein the latch circuit provides a phase adjustment signal as an output signal thereof and wherein the latch circuit receives a reset signal from a DLL control unit in the DLL circuit.

* * * * *